United States Patent
Lee et al.

(10) Patent No.: US 6,837,943 B2
(45) Date of Patent: Jan. 4, 2005

(54) METHOD AND APPARATUS FOR CLEANING A SEMICONDUCTOR SUBSTRATE

(75) Inventors: Kwang-wook Lee, Sungnam (KR); In-Seak Hwang, Suwon (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/320,575

(22) Filed: Dec. 17, 2002

(65) Prior Publication Data

US 2004/0112405 A1 Jun. 17, 2004

(51) Int. Cl.⁷ .............................................. B08B 7/00
(52) U.S. Cl. ..................... 134/19; 134/1; 134/1.3; 134/2; 134/26; 134/32; 134/33; 134/902; 156/345.11; 156/345.18; 156/345.21; 156/345.23
(58) Field of Search .......................... 134/1, 1.3, 2, 19, 134/26, 32, 33, 902, 105, 153; 156/345.11, 345.18, 345.21, 345.23; 438/905

(56) References Cited

U.S. PATENT DOCUMENTS

| 6,025,575 A | 2/2000 | Park et al. |
| 6,312,556 B1 | 11/2001 | Donohoe et al. |
| 6,402,974 B1 | 6/2002 | Trevor et al. |
| 6,495,215 B1 * | 12/2002 | Kamikawa .................. 427/541 |
| 2002/0092542 A1 * | 7/2002 | Park et al. .................. 134/1.3 |

FOREIGN PATENT DOCUMENTS

| JP | 02009483 | * | 1/1990 |
| JP | 411125917 | * | 5/1999 |
| JP | 20000164555 | * | 6/2000 |
| JP | 20011351774 | * | 12/2001 |

* cited by examiner

*Primary Examiner*—M. Kornakov
(74) *Attorney, Agent, or Firm*—Volentine Francos & Whitt, PLLC

(57) ABSTRACT

A stripping solution is supplied onto the surface of a substrate and an alternating magnetic flux is applied to the substrate. The alternating magnetic flux induces a current in a conductive pattern of the substrate which heats the conductive pattern while the stripping solution is in contact with the substrate. The stripping solution, containing particles to be cleaned off the substrate, is then removed from the substrate.

29 Claims, 3 Drawing Sheets

METHOD AND APPARATUS FOR CLEANING A SEMICONDUCTOR SUBSTRATE

BACKGROUND OF THE INVENTION

1. Field of the Invention

The present invention generally relates to the manufacture of semiconductor devices, and more particularly, the present invention relates to a method and apparatus for cleaning a semiconductor substrate.

2. Description of the Related Art

Subsequent to the completion of certain processes in the manufacture of semiconductor devices, it is necessary to clean the surface of a semiconductor wafer or substrate prior to proceeding to a next process. One such process which necessitates cleaning is the patterning of a metal film formed over the surface of the wafer. Here, a mask pattern is applied to a metal film, such as a tungsten or aluminum film, and the resultant is subjected to dry etching to remove portions of the metal film not covered by the mask, thus achieving a corresponding metal film pattern. After this process, the after must be cleaned to remove etch residues and metal polymers which may have formed at surfaces of the patterned metal.

Typically, the wafer is cleaned by dipping the wafer into a wet bath containing an organic stripping solution. An example of one such solution is the mixture of diglycolamine (DGA), hydroxylamine (HA), catechol, and water, at a ratio 60:16:5:19. In this example, DGA is an organic solvent, catechol is an additive, and HA is an amine-based reducing agent. The amine-based reducing agent functions to remove the metal polymers by breaking the linkages between the metallic polymer chains, and the organic solvent functions to dissolve the thus broken metallic polymer chains.

However, stripping solutions containing amine-based reducing agents such as HA do a poor job of removing metal-polymers containing a large quantity of oxygen and silicon. As such, stripping solutions containing fluorine, such as hydrofluoric acid (HF) have recently been developed in an effort to enhance the stripping solution's ability to remove metal-polymers and the etch residues.

Unfortunately, while stripping solutions containing fluorine do achieve improved removal of the metal polymers and etch residues, they also disadvantageously etch away at the thin dielectric layer underlying the metal pattern film layer. This is because the thin dielectric layer, such as BPSG, is easily etched when exposed to chemical solutions containing fluorine. Excessive etching of the thin dielectric can adversely affect device performance and yields. Accordingly, when using stripping solutions containing fluorine, there is a tradeoff between the effective removal of metal polymers and the undesired etching of the underlying thin dielectric.

SUMMARY OF THE INVENTION

According to one aspect of the present invention, a method is provided for cleaning a substrate which includes a conductive pattern located at a surface of the substrate, where the method includes supplying a stripping solution to the surface of the substrate and applying an alternating magnetic flux to the substrate, wherein the alternating magnetic flux induces a current in the conductive pattern which heats the conductive pattern while the stripping solution is in contact with the substrate; and removing the stripping solution from the substrate.

According to another aspect of the present invention, a method is provided for cleaning a substrate which includes a conductive pattern located at a surface of the substrate, where the method includes loading the substrate onto a rotatable chuck; supplying a stripping solution to the surface of the substrate and rotating the substrate to distribute the stripping solution across the surface of the substrate; applying an alternating magnetic flux to the substrate, wherein the alternating magnetic flux induces a current in the conductive pattern which heats the conductive pattern while the stripping solution is in contact with the substrate, and wherein the stripping solution is locally heated at the conductive pattern; removing the stripping solution by applying a rinsing solution to the substrate and rotating the substrate; and drying the substrate.

According to still another aspect of the present invention, an apparatus for cleaning a substrate is provided, where the apparatus includes a rotatable chuck having a substrate support surface; a stripping solution supply mechanism positioned over the substrate support surface of the rotatable chuck; a coil; and an alternating current power supply coupled to the coil so as to supply an alternating current to the coil, wherein the alternating current of the coil creates an alternating magnetic flux over the substrate support surface, and wherein the alternating magnetic flux is sufficient to heat a conductive pattern of a substrate placed on the substrate support surface.

BREIF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

As discussed above, in conventional techniques, enhancing the reducing power of the stripping solution by adding fluorine has the advantage of improving the removal of metal polymers and the like from the conductive pattern, but is accompanied by the disadvantage of etching the underlying thin dielectric layer. The present invention aims to overcome or minimize the effects of this tradeoff by locally enhancing the reducing power of the stripping solution in a vicinity of the conductive pattern. In particular, eddy currents are induced in the conductive pattern, and resultant eddy current losses are naturally converted to heat which in turn increases a temperature of the conductive pattern. The increase in temperature of the conductive pattern increases the temperature of the portions of stripping solution in contact with the conductive pattern. As is generally known in the art, the reducing power of a stripping solution increases with temperature. Thus, the reducing power of the stripping solution in close proximity to the conductive pattern is increased to a greater extent than that at a distance from the conductive pattern. In this manner, a reducing power is achieved which is greater at the conductive pattern than at an underlying thin dielectric.

Various non-limiting and illustrative embodiments of the present invention will now be described in detail with reference to the accompanying drawings. It is noted that the drawings are not necessarily drawn to scale, and that relative component sizes may be exaggerated for illustrative purposes.

Figure 1:
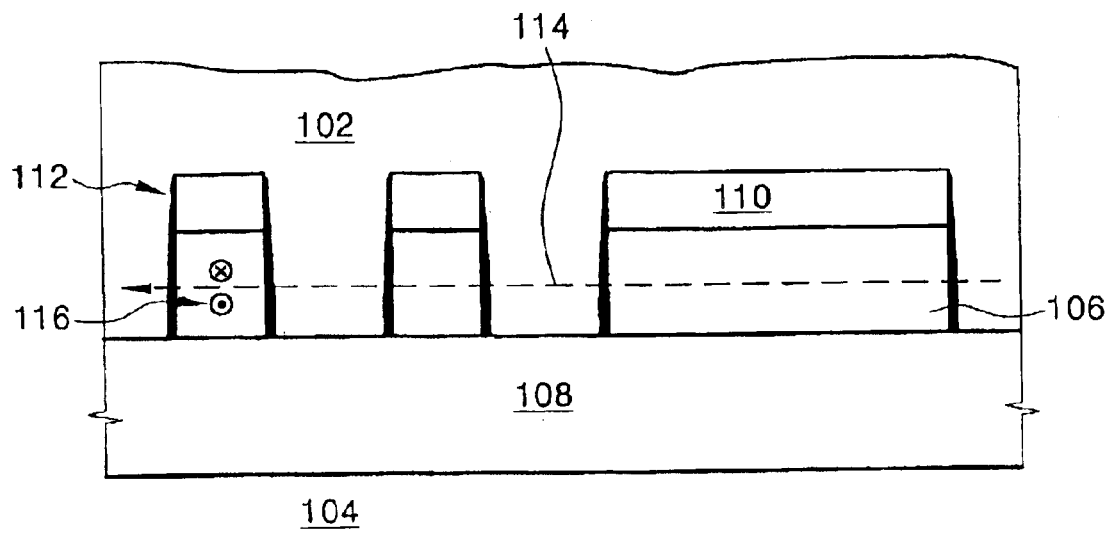
FIG. 1 is a schematic cross-sectional view of a stripping solution applied to semiconductor substrate having a conductive pattern according to an embodiment of the present invention.

Referring first to FIG. 1, a schematic cross-sectional view is shown in which stripping solution 102 is applied to the surface of semiconductor substrate 104. The substrate 104 includes a conductive pattern 106 and hard mask pattern 110 over the surface thereof. Typically, but not necessarily, the conductive pattern 106 is formed of aluminum or tungsten. Also typically, but not necessarily, a thin dielectric layer 108 is interposed between the surface of the substrate 104 and the conductive pattern 106. For example, the thin dielectric layer 108 may be an ILD (Interlayer Dielectric) layer or an IMD (Inter Metal Dielectric) formed of BPSG. Reference number 112 denotes metal polymers which have formed at sidewalls of the conductive pattern 106 and the hard mask pattern 110.

The stripping solution 102 is supplied to remove the hard mask pattern 110 and residues thereof, and to further remove the metal polymers 112. An alternating magnetic flux 114 is generated to induce eddy currents 116 in the conductive pattern 106. For example, the alternating magnetic flux may have a frequency in the range of 1 kHz to 1 MHz. Resultant eddy current losses are naturally converted to heat which in turn increases a temperature of the conductive pattern 106. The increase in temperature of the conductive pattern 106 increases the temperature of the portions of stripping solution 102 in contact with the conductive pattern 106. Since the reducing power of stripping solutions generally increases with temperature, the reducing power of the stripping solution 102 in close proximity to the conductive pattern 106 is increased to a greater extent than that at a distance from the conductive pattern 106. In this manner, a reducing power is achieved which is greater at the conductive pattern 106 than at underlying dielectric 108, and accordingly, undesired etching of the dielectric 108 is minimized or avoided, while at the same time enhancing the stripping of the metal polymers 112.

Figure 2:
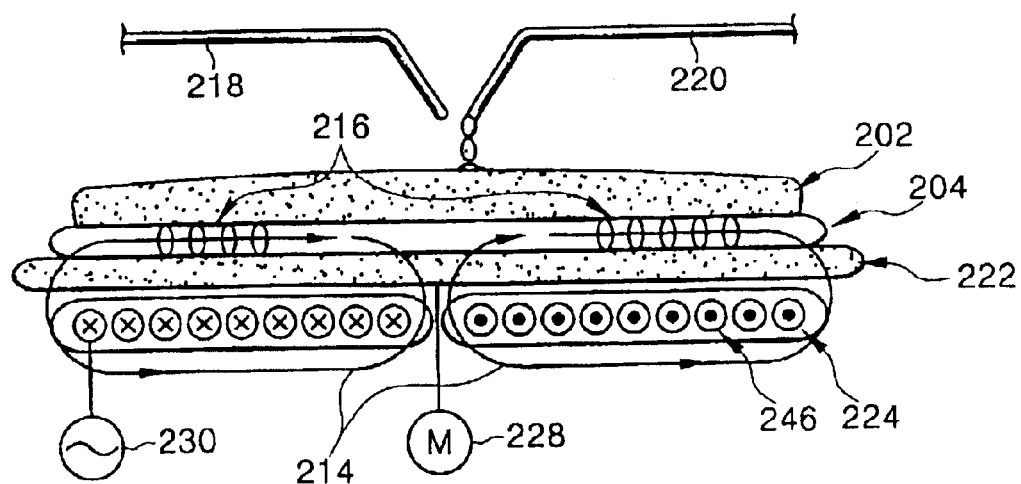
FIG. 2 is a schematic illustration of an apparatus for cleaning a semiconductor substrate according to an embodiment of the present invention.

FIG. 2 illustrates an example of an apparatus for cleaning a wafer according to an embodiment of the present invention.

Referring to FIG. 2, a wafer chuck 222 supports a wafer 204 to be cleaned. A coil 224 is disposed under the wafer chuck 222, and generates alternating magnetic fluxes 214 so as to induce eddy currents 216 in the wafer 204.

The source of magnetic flux, such as the coil 224 of FIG. 2, need not be positioned under the chuck 222. For example, the coil 224 may be embedded within the body of the wafer chuck 222. As one of ordinary skill in the art would appreciate, the source may be positioned at any location in which sufficient eddy currents will be induced in the conductive pattern. Preferably, however, the coil is located below the chuck, or within the chuck, so as to avoid interference with the supply of stripping solution and rinse.

Still referring to FIG. 2, a motor M 228 is for rotating the wafer to dry the wafer and/or to disperse the stripping solution 202 over the surface of the wafer 204, and an alternating current supply 230 is for applying an alternating current to the coil 224.

Figure 3:
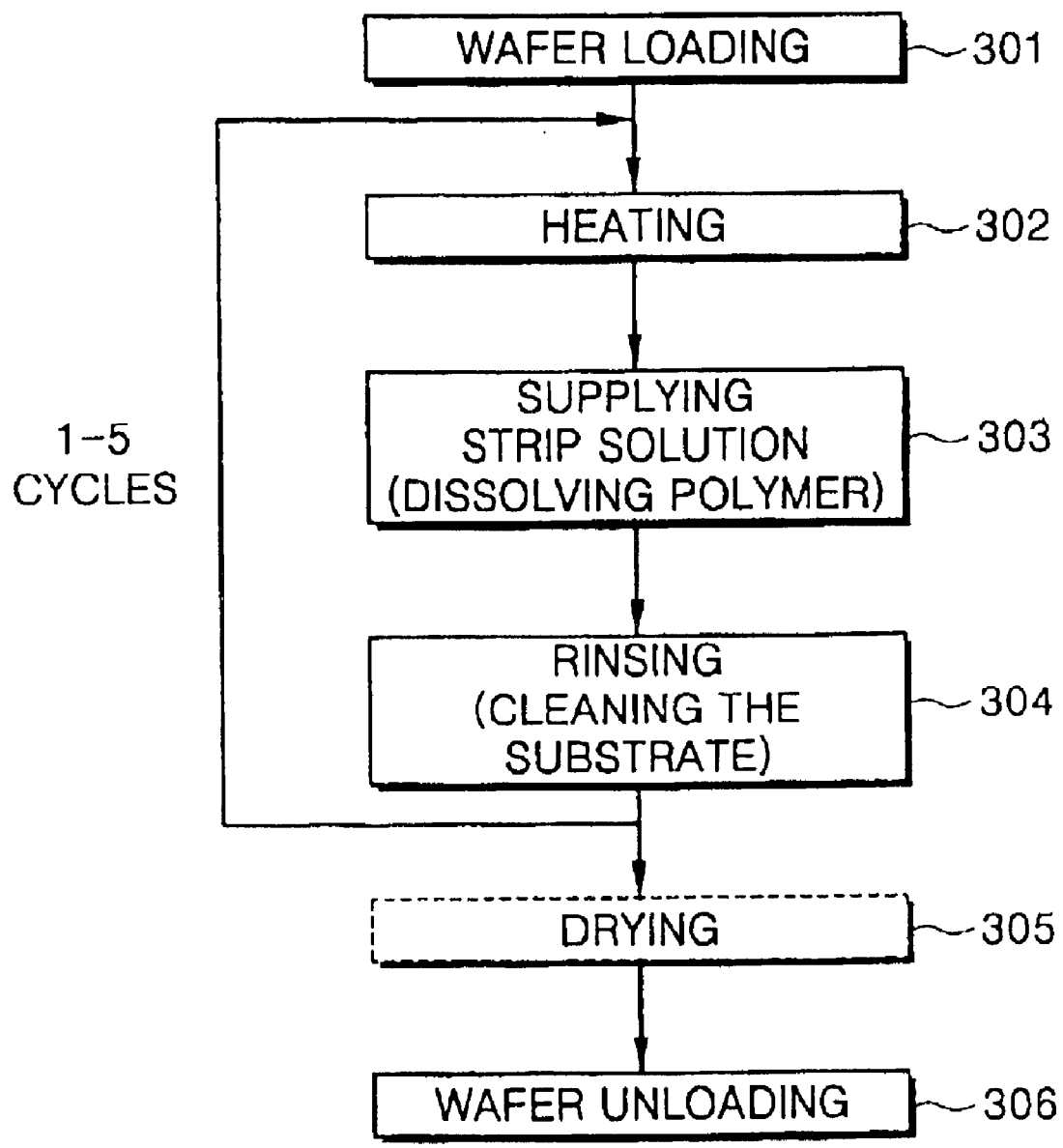
FIG. 3 is a flow diagram for explaining a method of cleaning a semiconductor substrate according to an embodiment of the present invention.

FIG. 3 is a flowchart for explaining a wafer cleaning process according to one embodiment of the present invention.

Initially, at 301, the wafer is loaded onto a spin chuck within a cleaning chamber. Then, at 302, localized heating of a conductive pattern is effected by applying an alternating current to a coil located in a vicinity of the chuck to generate eddy currents in the conductive pattern. The resultant eddy current losses are converted to heat in the conductive pattern. Preferably, the alternating current is applied to the coil for a time period which is long enough to locally heat the conductive pattern, but not so long that substantial heat is transferred to the dielectric layer. Also preferably, the conductive pattern is heated to a temperature of 35° C. to 135° C.

Either after or during the application of alternating current to the coil, a stripping solution is supplied at 303 to the entire surface of the wafer. The stripping solution is preferably an organic solvent mixed with an amine-based reducing agent, and also preferably, the stripping solution is devoid of fluorine to avoid damage to the underlying dielectric. Alternatively, however, fluorine made be included in the stripping solution if the application time of the solution is reduced to avoid dielectric damage. A nozzle 220 may be used to inject the stripping solution onto the wafer. Also, the wafer may be rotated at a constant speed in order to evenly disperse the solution over the surface of the wafer. The localized heating of the conductive pattern at 302 results in localized heating of portions of the stripping solution in the vicinity of the conductive pattern. Preferably, the stripping solution is heated to a temperature of 30° C. to 90° C. in a vicinity of the conductive pattern. As such, a reducing power of the stripping solution is locally increased at the conductive patterns, thereby enhancing the removal of metal polymers while avoiding etching of the underlying dielectric (e.g. BPSG layer).

Then, at 304, a rinsing process is carried out in which a solution such as distilled or deionized water (DIW) is injected onto the wafer from nozzle 218, The rinsing process, which may be accompanied by rotation of the wafer during and/or after the DIW is applied, is effective to remove the stripping solution and contaminants such as etch residue from a previously conducted etching process. As shown in FIG. 3, the processes 302–304 are together considered a single cleaning cycle, which may be carried out one or more times as necessary. Without intending to limit the scope of the invention, it is considered that as few as one cleaning cycle may be sufficient, an that no more than five cleaning cycles should be needed.

Then, at 305 and 306, the wafer is dried, for example, by spin drying, and unloaded from the wafer chuck.

Figure 4:
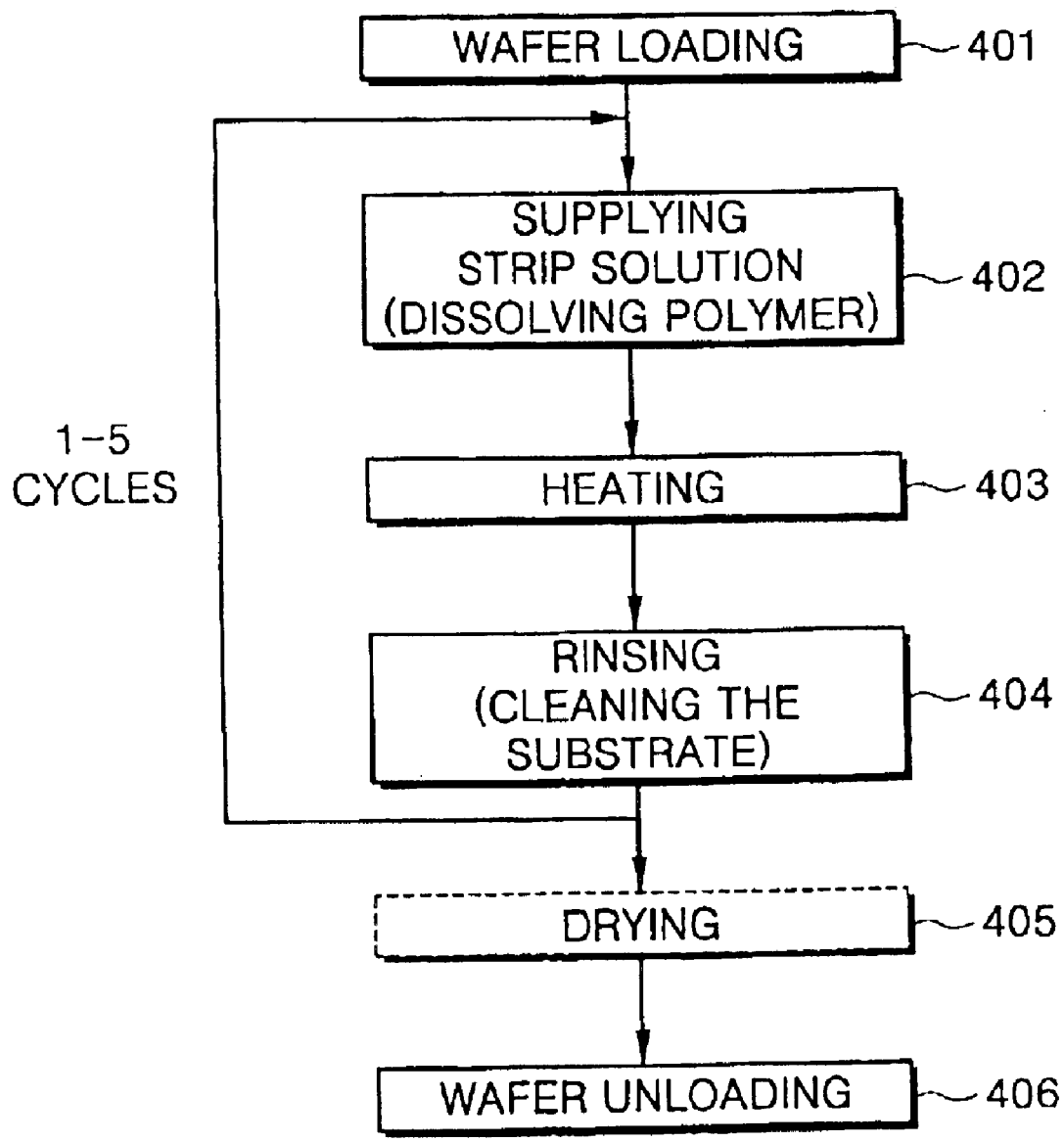
FIG. 4 is a flow diagram for explaining a method of cleaning a semiconductor substrate according to another embodiment of the present invention.

FIG. 4 is a flowchart for explaining a wafer cleaning process according to another embodiment of the present invention.

Initially, at 401, the wafer is loaded onto a spin chuck within a cleaning chamber. Then, at 402, a stripping solution is supplied to the entire surface of the wafer. The stripping solution is preferably an organic solvent mixed with an amine-based reducing agent, and also preferably, the stripping solution is devoid of fluorine to avoid damage to the underlying dielectric. Alternatively, however, fluorine made be included in the stripping solution if the application time of the solution is reduced to avoid dielectric damage. A nozzle may be used to inject the stripping solution onto the wafer. Also, the wafer may be rotated at a constant speed in order to evenly disperse the solution over the surface of the wafer.

Then, either prior to or after completion of the supply of stripping solution, localized heating of a conductive pattern is effected at 403 by applying an alternating current to a coil located in a vicinity of the chuck to generate eddy currents in the conductive pattern. The resultant eddy current losses are converted to heat in the conductive pattern. Preferably, the alternating current is applied to the coil for a time period which is long enough to locally heat the conductive pattern, but not so long that substantial heat is transferred to the dielectric layer. Also preferably, the conductive pattern is heated to a temperature of 35° C. to 135° C. The localized heating of the conductive pattern at 402 results in localized heating of portions of the stripping solution in the vicinity of the conductive pattern. Preferably, the stripping solution is heated to a temperature of 30° C. to 90° C. in a vicinity of the conductive pattern. As such, a reducing power of the stripping solution is locally increased at the conductive patterns, thereby enhancing the removal of metal polymers while avoiding etching of the underlying dielectric (e.g. BPSG layer).

Then, at 404, a rinsing process is carried out in which a solution such as distilled or deionized water (DIW) is injected onto the wafer from a nozzle. The rinsing process, which may be accompanied by rotation of the wafer during and/or after the DIW is applied, is effective to remove the stripping solution and contaminants such as etch residue from a previously conducted etching process. As shown in FIG. 4, the processes 402–404 are together considered a single cleaning cycle, which may be carried out one or more times as necessary. Without intending to limit the scope of the invention, it is considered that as few as one cleaning cycle may be sufficient, and that no more than five cleaning cycles should be needed.

Then, at 405 and 406, the wafer is dried, for example, by spin drying, and unloaded from the wafer chuck.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A method of removing a targeted substance from a substrate which includes a conductive pattern located at a surface of the substrate, the substance being located adjacent the conductive pattern, said method comprising:

a chemical treatment comprising supplying a stripping solution to the surface of the substrate, the stripping solution having an ability to remove the targeted substance and which ability is enhanced when the stripping solution is heated, while the stripping solution is on the surface of the substrate, inducing a current in the conductive pattern by exposing the substrate to an alternating magnetic flux to thereby heat the conductive pattern, such that the stripping solution adjacent the conductive pattern is heated, and maintaining the heated stripping solution on the surface of the substrate for a period of time sufficient for the heated stripping solution to remove at least some of the targeted substance from adjacent the conductive pattern; and a subsequent cleaning process of removing the stripping solution from the substrate.

2. The method as claimed in claim 1, further comprising rotating the substrate to distribute the stripping solution across the surface of the substrate.

3. The method as claimed in claim 1, wherein the stripping solution is removed by applying a rinsing solution to the substrate.

4. The method as claimed in claim 3, further comprising rotating the substrate during or after application of the rinsing solution.

5. The method as claimed in claim 3, further comprising rotating the substrate to dry the substrate after said application of the rinsing solution.

6. The method as claimed in claim 1, wherein the substance is a metal polymer, the stripping solution comprises an organic solvent mixed with an amine-based reducing agent, and said inducing of a current in the conductive pattern heats the stripping solution to a temperature of 30° C. to 90° C. in the vicinity of the conductive pattern.

7. The method as claimed in claim 1, wherein the substance is a metal polymer, the striping solution comprises an organic solvent mixed with an amine-based reducing agent, and said inducing of a current in the conductive pattern heats the conductive pattern to a temperature of 35° to 135° C.

8. The method as claimed in claim 1, wherein the stripping solution comprises an organic solvent mixed with an amine-based reducing agent.

9. The method as claimed in claim 7, wherein the stripping solution is devoid of fluorine.

10. The method as claimed in claim 8, wherein the substrate further includes a BPSG layer underlying the conductive layer.

11. A method of removing a targeted substance from a substrate which includes a conductive pattern located at a surface of the substrate, the substance being located adjacent the conductive pattern, said method comprising:

loading the substrate onto a rotatable chuck;

a chemical treatment comprising supplying a stripping solution to the surface of the substrate, the stripping solution having an ability to remove the targeted substance and which ability is enhanced when the stripping solution is heated, rotating the substrate to distribute the stripping solution across the surface of the substrate, and applying an alternating magnetic flux to the substrate, wherein the alternating magnetic flux induces a current in the conductive pattern which heats the conductive pattern while the stripping solution is in contact with the substrate, and wherein the stripping solution is locally heated at the conductive pattern;

a subsequent cleaning process of removing the stripping solution by applying a rinsing solution to the substrate and rotating the substrate; and a subsequent process of drying the substrate.

12. The method as claimed in claim 11, wherein application of the alternating magnetic flux is initiated prior to supply of the stripping solution.

13. The method as claimed in claim 12, wherein said applying the alternating magnetic flux, said supplying the stripping solution, and said removing the stripping solution, are repeated in sequence a plurality of times prior to said drying the substrate.

14. The method as claimed in claim 11, wherein supply of the stripping solution is initiated before application of the alternating magnetic flux.

15. The method as claimed in claim 14, wherein said supplying the stripping solution, said applying the alternating magnetic flux, and said removing the stripping solution, are repeated in sequence a plurality of times prior to said drying the substrate.

16. The method as claimed in claim 11, wherein the alternating magnetic flux is applied by applying an alternating current to a coil positioned below the chuck relative to the substrate.

17. The method claimed in claim 11, wherein the alternating magnetic flux is applied by applying an alternating current to a coil embedded within the chuck.

18. The method as claimed in claim 11, wherein a frequency of the alternating magnetic flux is in a range of 1 kHz to 1 MHz.

19. A method of removing a targeted substance from a substrate which includes a conductive pattern located at a surface of the substrate, the substance being located adjacent the conductive pattern, said method comprising:

a chemical treatment comprising inducing a current in the conductive pattern which heats the conductive pattern, supplying a stripping solution to the surface of the substrate, and maintaining the stripping solution on the surface of the substrate for a period of time while the conductive pattern is heated such that the stripping solution adjacent the conductive pattern is heated and at least some of the targeted substance is removed from adjacent the conductive pattern by the heated stripping solution; and a subsequent cleaning process of removing the stripping solution from the substrate.

20. The method as claimed in claim 1, wherein the only field to which the substrate is exposed, while the stripping solution is being heated, is a magnetic field.

21. The method as claimed in claim 11, wherein the only field to which the substrate is exposed, while the stripping solution is being heated, is a magnetic field.

22. An apparatus for cleaning a substrate, said apparatus comprising:

a rotatable chuck having a substrate support surface;

a stripping solution supply mechanism positioned over the substrate support surface of the rotatable chuck;

a coil; and an alternating current power supply coupled to the coil so as supply an alternating current to the coil, wherein said coil is disposed relative to said substrate support surface such that the alternating current of the coil creates an alternating magnetic flux over the substrate support surface, and wherein the alternating magnetic flux is sufficient to heat a conductive pattern of a substrate placed on the substrate support surface.

23. An apparatus as claimed in claim 22, wherein the rotatable chuck is made of an electrically non-conductive material.

24. An apparatus as claimed in claim 23, wherein the coil is located below chuck opposite the substrate support surface.

25. An apparatus as claimed in claim 23, wherein the coil is embedded within the chuck.

26. An apparatus as claimed in claim 22, wherein the stripping solution supply mechanism includes a nozzle outlet located over a center region of the substrate support surface of the rotatable chuck.

27. An apparatus as claimed in claim 25, further comprising a rinsing solution nozzle outlet located over the center region of the substrate support surface of the chuck.

28. An apparatus as claimed in claim 22, further comprising a motor for rotating the chuck.

29. An apparatus as claimed in claim 22, wherein a frequency of the alternating current supplied by the alternating current supply is in a range of 1 kHz to 1 MHz.

* * * * *